(12) United States Patent
Chiu

(10) Patent No.: US 7,581,639 B2
(45) Date of Patent: Sep. 1, 2009

(54) PHOTO MASK RETAINER FOR PHOTO MASK DELIVERY BOX

(75) Inventor: Ming-Chien Chiu, Taipei Hsien (TW)

(73) Assignee: Gudeng Precision Industrial Co., Ltd., Taipei Hsien (TW)

( * ) Notice: Subject to any disclaimer, the term of this patent is extended or adjusted under 35 U.S.C. 154(b) by 233 days.

(21) Appl. No.: 11/518,201

(22) Filed: Sep. 11, 2006

(65) Prior Publication Data

US 2007/0085992 A1     Apr. 19, 2007

(30) Foreign Application Priority Data

Oct. 18, 2005     (TW)  .............................. 94218015 U

(51) Int. Cl.
*B65D 85/48*     (2006.01)
(52) U.S. Cl. ........................................ 206/454; 206/480
(58) Field of Classification Search ......... 206/451–454, 206/710, 722–725, 480, 482, 483, 832; 211/41.17, 211/41.18; 24/16 R, 455; 118/500; 355/75, 355/53, 72
See application file for complete search history.

(56) References Cited

U.S. PATENT DOCUMENTS

| | | | | |
|---|---|---|---|---|
| 3,532,213 | A * | 10/1970 | Chase et al. | 206/454 |
| 4,535,887 | A * | 8/1985 | Egawa | 206/724 |
| 4,767,984 | A * | 8/1988 | Bakker | 206/724 |
| 5,363,956 | A * | 11/1994 | Taniyama | 206/483 |
| 5,971,156 | A * | 10/1999 | Slocum et al. | 206/724 |
| 7,088,430 | B2 * | 8/2006 | Chiu | 355/75 |

* cited by examiner

*Primary Examiner*—Luan K Bui
(74) *Attorney, Agent, or Firm*—Ming Chow; Sinorica, LLC

(57) ABSTRACT

A photo mask retainer, mounted inside a photo mask delivery box for holding a photo mask, in which the photo mask retainer includes a base, a U-turn extending from the top of the rear side of the base and curving toward the top side of the base, a bearing portion formed on the free end of the U-turn for pressing on the vertical peripheral sidewall of the photo mask, a retaining end portion formed on the free end of the U-turn for pressing on the top surface of the photo mask, and a clamp extending from the front side of the base for fastening to a respective locating block on the wall surface of the photo mask delivery box

14 Claims, 10 Drawing Sheets

PHOTO MASK RETAINER FOR PHOTO MASK DELIVERY BOX

BACKGROUND OF THE INVENTION

1. Field of the Invention

The present invention relates to a photo mask delivery box and more specifically, to a photo mask retaining structure for use in SMIF system. The photo mask delivery box holds the photo mask firmly in place against displacement, preventing the generation of particles to reduce contamination levels.

2. Description of the Related Art

Following fast development of high technology, a variety of high-tech products have been developed and intensively used in our daily life, bringing a great convenience to human beings. It is necessary to employ new knowledge and techniques to control high-tech products such as computer, new generation TV, digital stereo system, central control of building, advanced car, aircraft, and other clothing, food, housing and transportation related products. These high-tech products use semiconductor chips obtained from wafers. A photo mask has precision electronic patterns, which is designed to be imprinted on to wafers. During fabrication, a delivery box is used to transport photo mask in the clean room for high precision processing.

Further, the novel standardized mechanical interface (SMIF) system is utilized in a clean room for the fabrication of ICs, which reduces particle contamination by significantly reducing particle fluxes onto wafers. During transportation, storage, and most processing steps, the gaseous media surrounding the photo mask is essentially stationary relative to the photo mask, and particles from exterior environments cannot enter the photo mask environments. The SMIF system of photo mask handling reduces photo mask particle contamination. In order to prevent damage to photo masks, photo mask delivery boxes are used to deliver photo masks. During delivery, photo masks must be maintained stable under a clean environment. However, photo mask delivery box may contain a certain amount of particles or impurities that are not visible to eyes. Therefore, photo mask delivery boxes must be regularly cleaned, ensuring a particle-free status. A minor particle contamination to the circuit pattern on a photo mask may cause a photo failure, resulting in a big yield loss. Because the semiconductor factory and wafer foundry use a big amount of photo masks, the requirement for photo mask delivery box is heavy. However, it is necessary to demount the photo mask delivery box before cleaning. Therefore, it is a heavy work to clean a big amount of photo mask delivery boxes regularly. Further, because a photo mask is an important and expensive device for the fabrication of wafers, damage to the photo masks during cleaning of photo mask delivery boxes delays the fabrication of wafers and relatively increases the manufacturing cost of wafers. A photo mask delivery box is generally made of anti-static material or the like to prevent the storage photo masks or wafers against electrostatic charge. When the anti-static material starts to deteriorate, it must be immediately replaced.

FIG. 8 shows a conventional photo mask delivery box. According to this design, the photo mask delivery box A has top and bottom locating rods A1 for stopping at the top and bottom sides of the storage photo mask B around the border area to hold the photo mask B inside the box A. According to this design, the locating rods A1 may wear or deform quickly with use, lowering the holding force. In this case, the storage photo mask B may be moved forwards and backwards and rubbed against the locating rods A1 during delivery of the photo mask delivery box A, thereby causing a big amount of airborne particles that increase contamination levels.

FIGS. 9 and 10 show another design of photo mask delivery box according to the prior art. According to this design, U-shaped holding blocks D are symmetrically located in the four corners inside the top and bottom cover shells of the photo mask delivery box C. When the photo mask delivery box C is closed, the U-shaped holding blocks D are respectively stopped against the four corners of the storage photo mask B from the top and bottom sides to hold the storage photo mask B in place. This design of photo mask delivery box C still cannot absolutely eliminate displacement of the storage photo mask B relative to the U-shaped holding blocks D during delivery of the photo mask delivery box C, and friction between the storage photo mask B and the U-shaped holding blocks D will generate particles, increasing contamination levels.

Therefore, it is desirable to provide a photo mask delivery box that holds the storage photo mask firmly in place against displacement, resulting from the friction between the storage photo mask and the internal parts of the photo mask delivery box and the generation of preventing particles.

SUMMARY OF THE INVENTION

The present invention has been accomplished under the circumstances in view. It is therefore the main object of the present invention to provide a photo mask retainer, which holds the storage photo mask firmly inside the photo mask delivery box against displacement, preventing the production of airborne particles and reducing contamination levels. According to one aspect of the present invention, a retainer of a photo mask delivery box having a bottom shell and a top cover shell to constitute an accommodating chamber for accommodating a photo mask. The retainer includes a base, a U-turn extending form the top of the rear side of the base and curving toward the top side of the base, a bearing portion formed on the free end of the U-turn that is used for pressing on the vertical peripheral sidewall of the photo mask, a retaining end portion formed on the free end of the U-turn for pressing on the top surface of the photo mask, and anchoring means for securing the base to the inside the photo mask delivery box. According to another aspect of the present invention, the U-turn has a sloping guide face on the outer wall that is used for guiding the photo mask into contact with the bearing portion and the retaining end portion.

DETAILED DESCRIPTION OF THE PREFERRED EMBODIMENT

Figure 1:
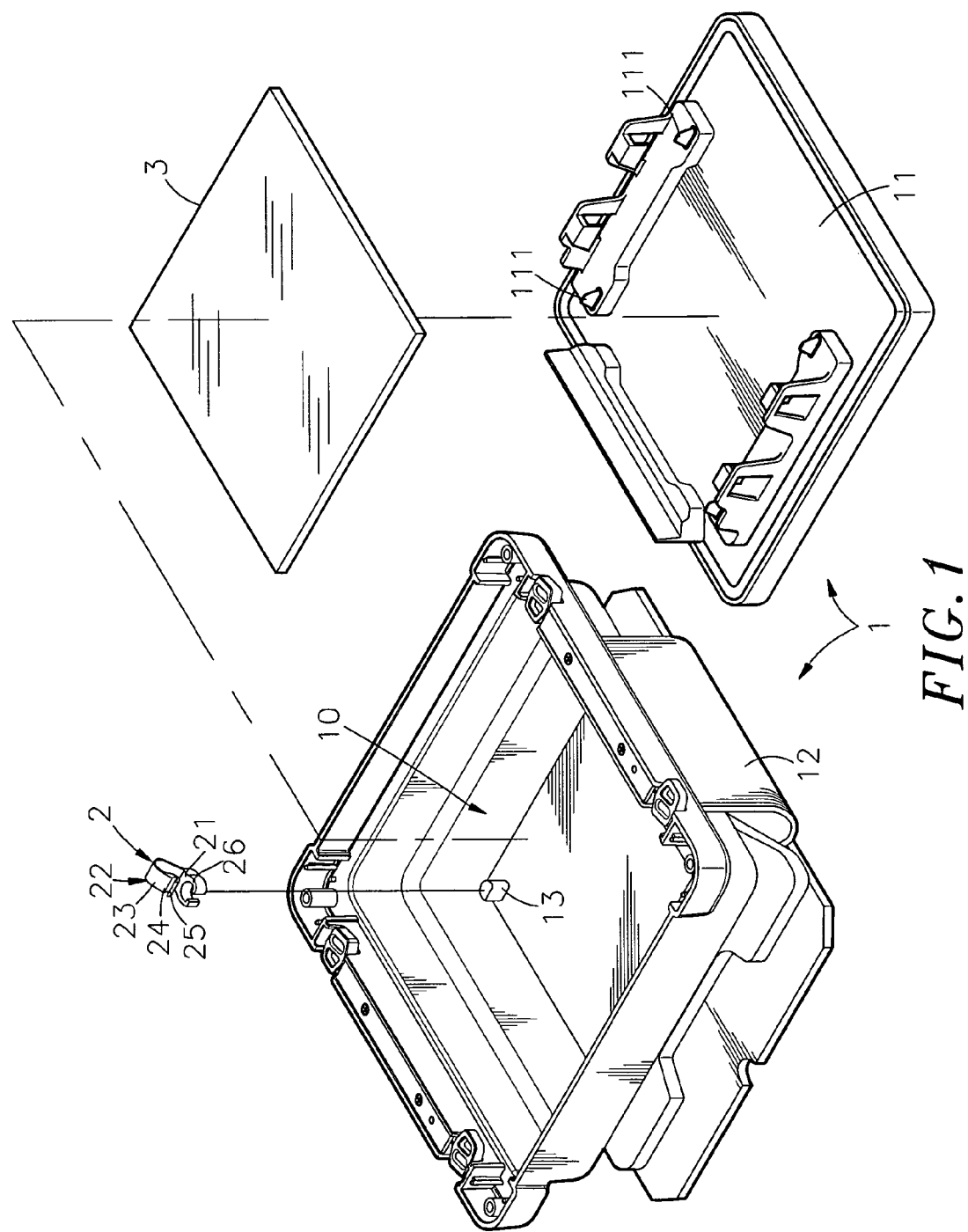
FIG. 1 is an exploded view of a photo mask delivery box according to the first embodiment of the present invention.
Figure 2:
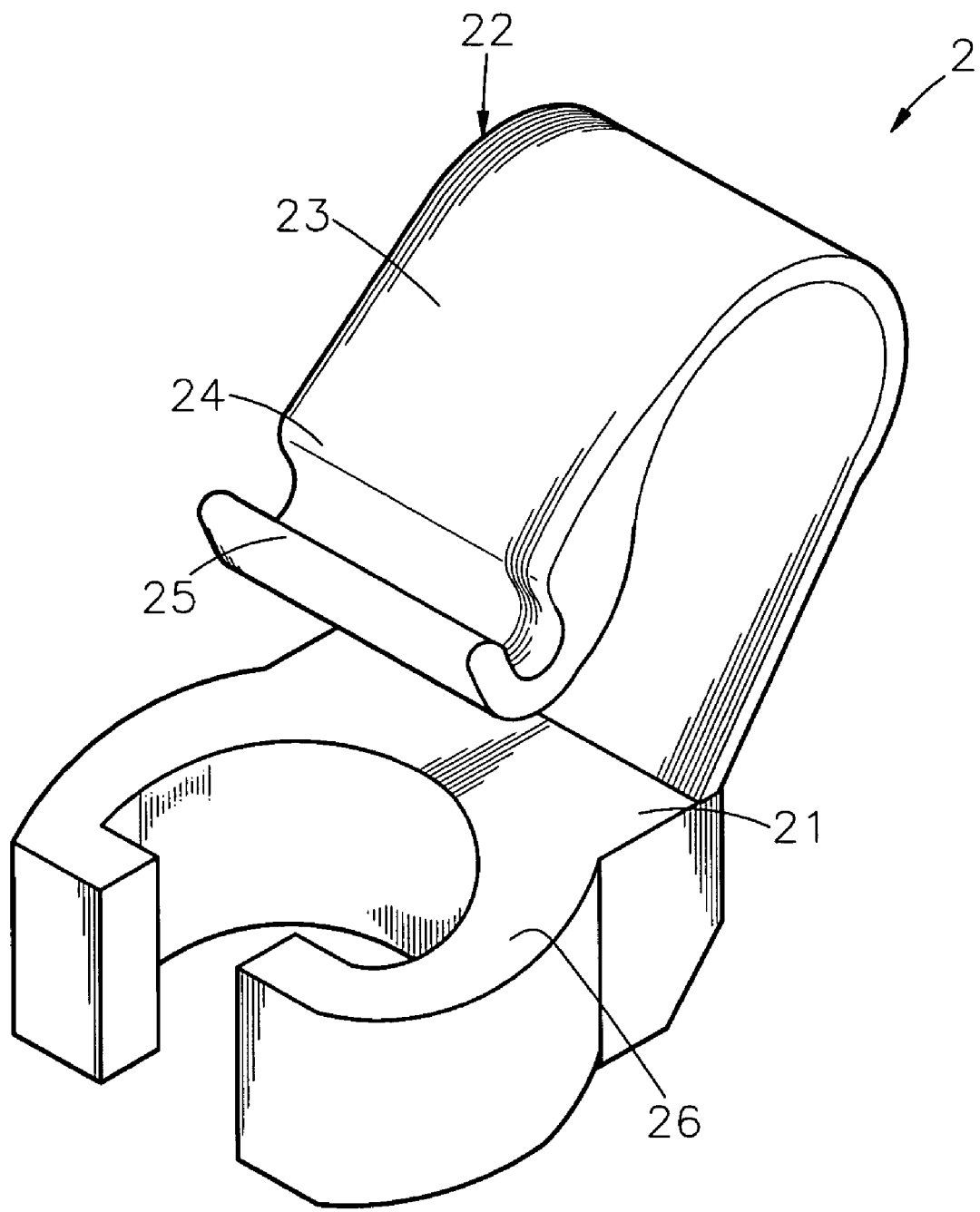
FIG. 2 is an elevational view of a photo mask retainer forused in a photo mask delivery box according to the first embodiment of the present invention.

Referring to FIGS. 1 and 2, a photo mask delivery box in accordance with the present invention is shown comprised of a box body 1 and a plurality of photo mask retainers 2.

The box body 1 comprises a bottom shell 11 and a top cover shell 12. The bottom shell 11 has a plurality of bearing blocks 111. The top cover shell 12 is covered on the bottom shell 11, defining an accommodating chamber 10 therebetween. Further, a plurality of locating blocks 13 are provided on the wall surface of the top cover shell 12.

Each photo mask retainer 2 comprises a base 21, a retaining end portion 25, a resiliently deformable U-turn 22 that connected between one side, namely, the rear end of the base 21 and the retaining end portion 25, a bearing portion 24 that connected between the U-turn 22 and the retaining end portion 25, a sloping guide face 23 formed on the outer wall of the U-turn 22 and extending to the bearing portion 24, and anchoring means, for example, a clamp 26 extended from the other side, namely, the front side of the base 21. According to this embodiment, the U-turn 22 is formed integral with a part of the base 21. Alternatively, the U-turn 22 and the base 21 can be separated each other. Further, by means of the respective clamp 26, the photo mask retainers 2 are respectively fastened to the locating blocks 13 on the wall surface of the top cover shell 12.

Figure 3:
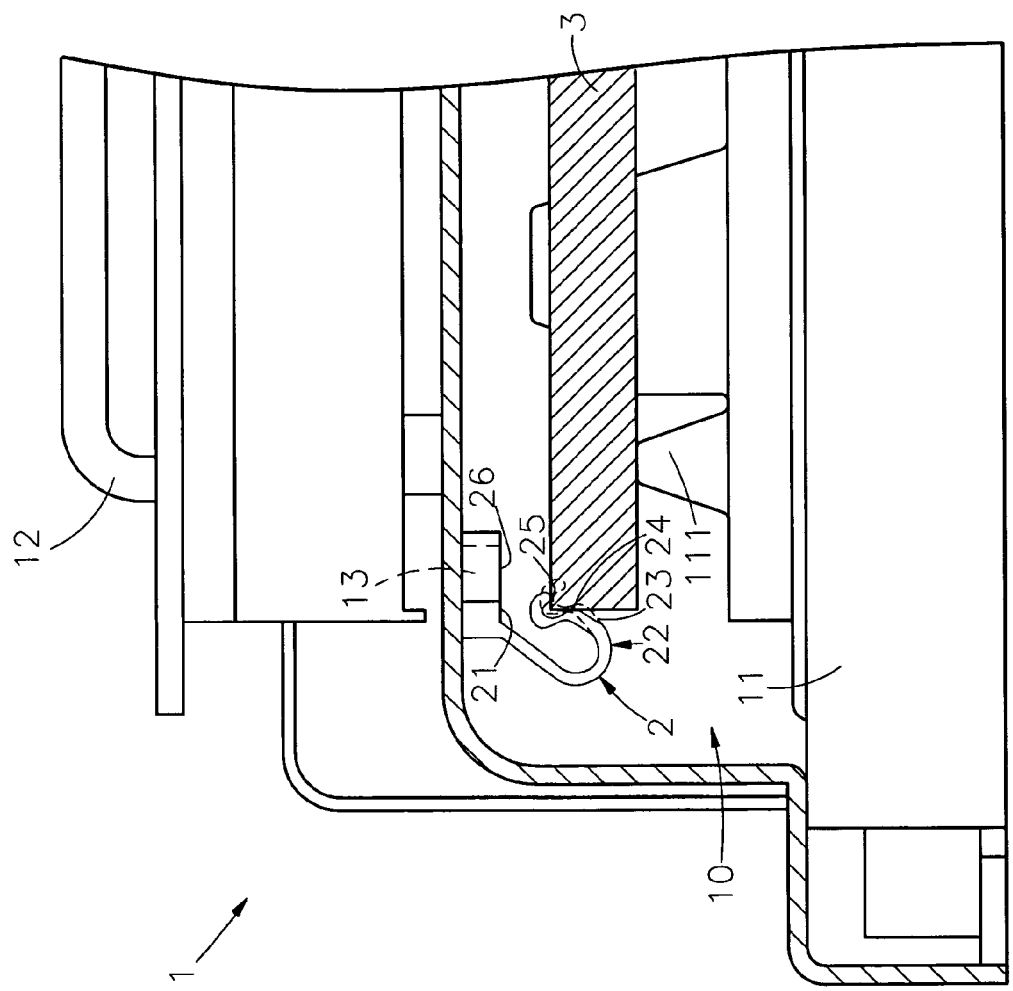
FIG. 3 is a schematic cross-section of the photo mask delivery box according to the first embodiment of the present invention, showing the photo mask retainers fastened to the storage photo mask on the bearing blocks inside the accommodating chamber of the box body.

Referring to FIG. 3 and FIGS. 1 and 2 again, a photo mask 3 is placed on the bearing blocks 111 and kept spaced above the bottom shell 11 at a distance for convenient access of a mechanical arm, and then the top cover shell 12 is closed on the bottom shell 11. When closing the top cover shell 12 on the bottom shell 11, the sloping guide face 23 of each of the photo mask retainer 2 moves the photo mask 3 into position. After the top cover shell 1 has been closed on the bottom shell 11, the bearing portions 24 of the photo mask retainers 2 are respectively stopped against the four vertical peripheral sidewalls of the photo mask 3, and the retaining end portions 25 of the photo mask retainers 2 are respectively pressed on the border area of the top surface of the photo mask 3, keeping the photo mask 3 firmly supported on the bearing blocks 111 inside the accommodating chamber 10. Because the photo mask 3 is supported on the springy U-turns 22 of the photo mask retainers 2, no friction will be produced between the photo mask 3 and the photo mask retainers 2 during delivery of the photo mask delivery box. Therefore, this invention prevents the production of particles, reducing contamination levels.

Referring to FIG. 3 again, the U-turn 22 extends from the top of the rear side of the base 21 and then curved toward the top side of the base 21. Therefore, only the free end, namely, the bearing portion 24 and retaining end portion 25 of each photo mask retainer 2 will be moved relative to the respective base 21. During delivery of the storage photo mask 3 with the photo mask delivery box, the springy U-turns 22 of the photo mask retainers 2 are compressible to absorb shocks, preventing displacement of the storage photo mask 3.

Figure 4:
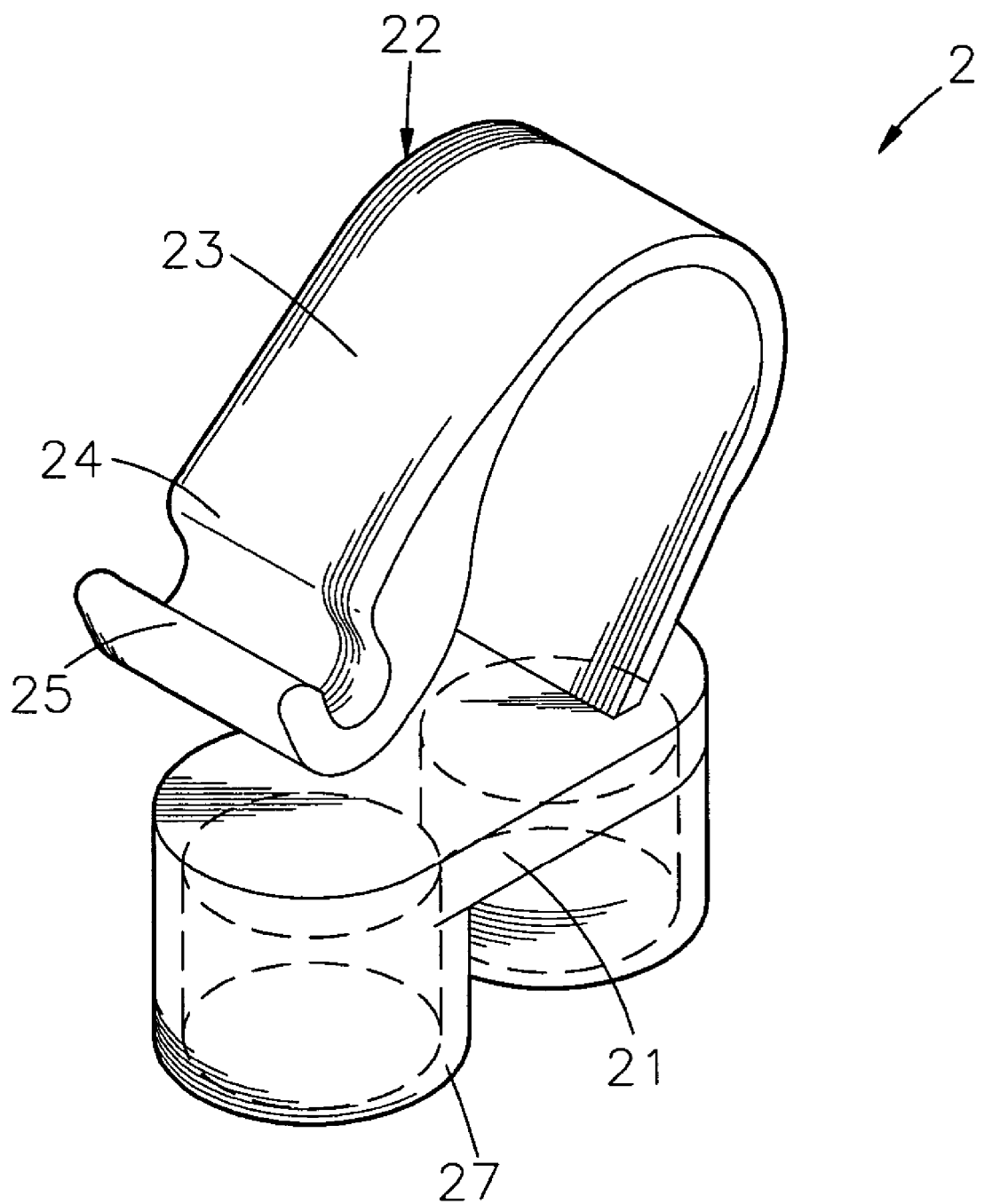
FIG. 4 is an elevational view of a photo mask retainer for used in a photo mask delivery box according to the second embodiment of the present invention.
Figure 5:
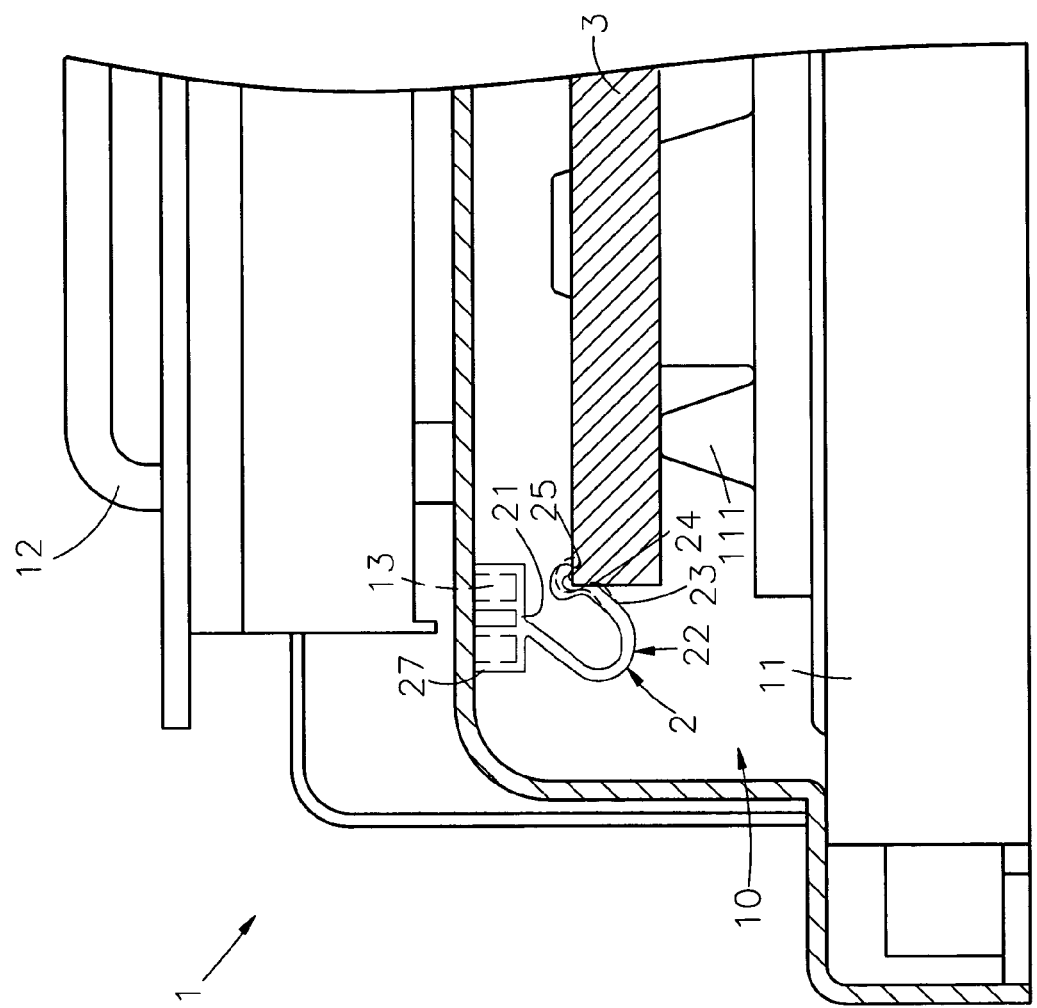
FIG. 5 is a schematic sectional view of the photo mask delivery box according to the second embodiment of the present invention, showing the photo mask retainers fastened to the storage photo mask on the bearing blocks inside the accommodating chamber of the box body.

FIGS. 4 and 5 show an alternate form of the present invention. According to this embodiment, the anchoring means of each photo mask retainer 2 is a socket 27, which is respectively press-fitted onto the locating blocks 13 inside the top cover shell 12. Same as the aforesaid first embodiment, the bearing portions 24 and retaining end portions 25 of the photo mask retainers 2 of this embodiment are respectively stopped against the vertical peripheral sidewalls and the top surfaces of the storage photo mask 3 to hold the storage photo mask 3 firmly on the bearing blocks 111 inside the accommodating chamber 10, preventing the generation of particles during delivery of the photo mask delivery box.

Figure 6:
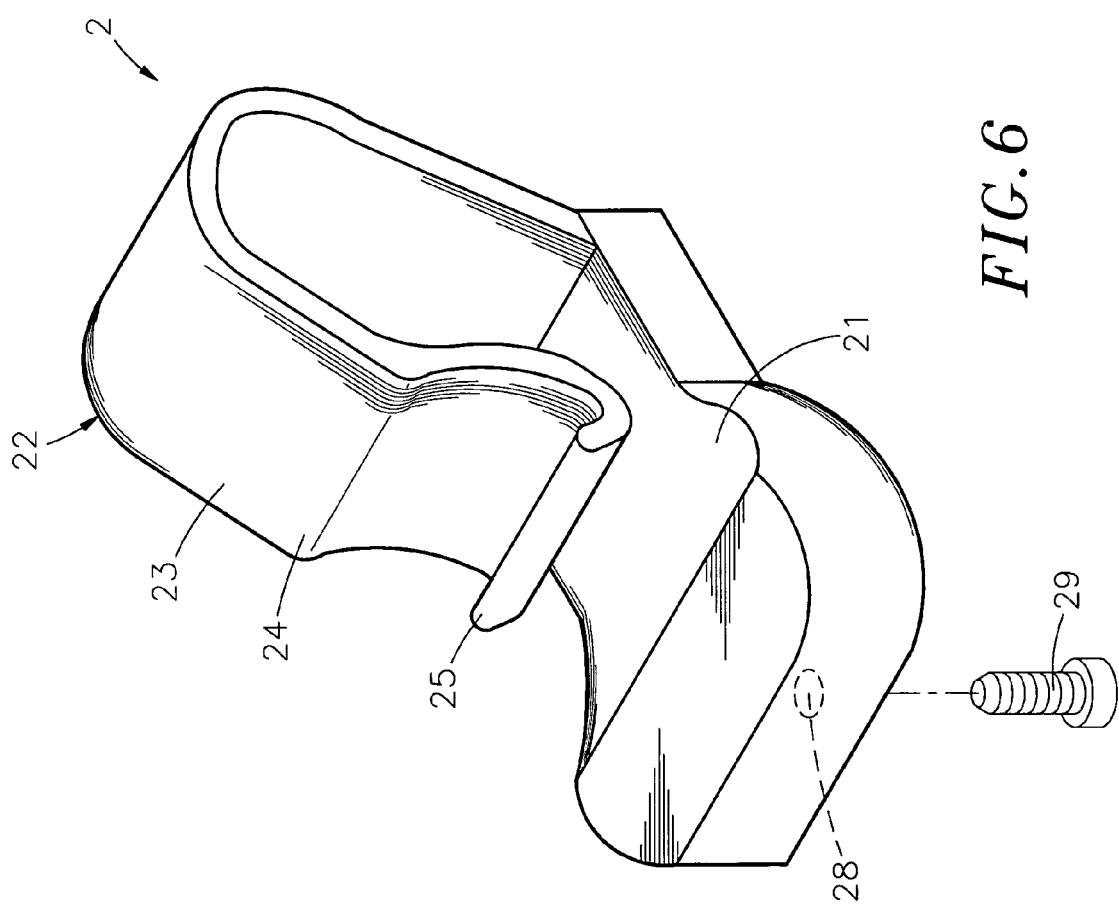
FIG. 6 is an elevational view of a photo mask retainer for used in a photo mask delivery box according to & the third embodiment of the present invention.
Figure 7:
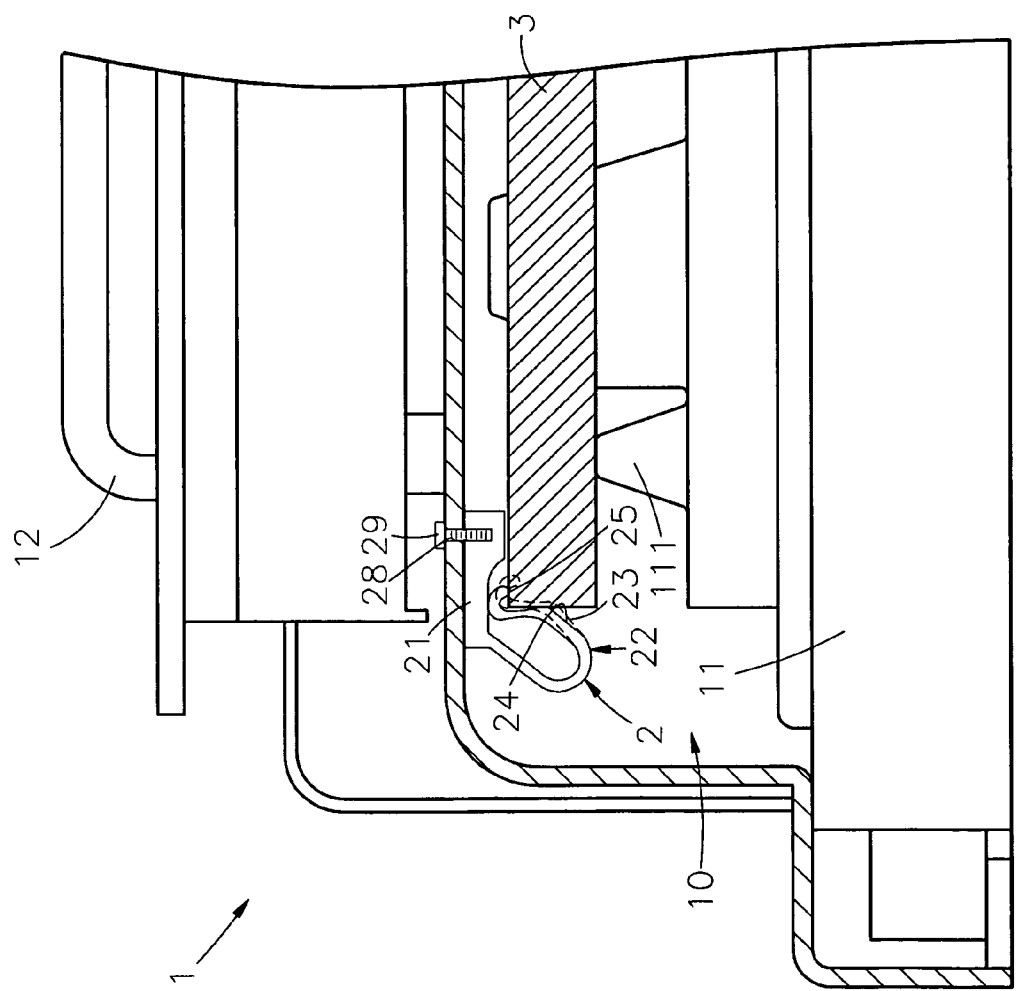
FIG. 7 is a schematic sectional view of the photo mask delivery box according to the third embodiment of the present invention, showing the photo mask retainers fastened to the storage photo mask on the bearing blocks inside the accommodating chamber of the box body.
Figure 8:
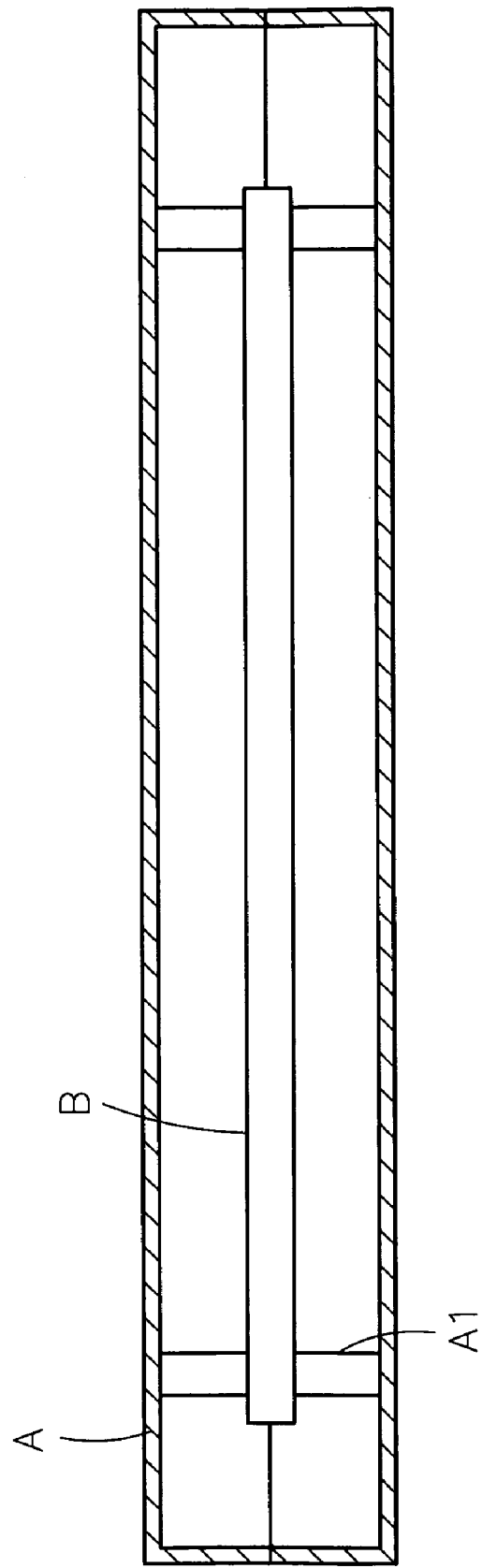
FIG. 8 is a cross-section of a photo mask delivery box according to the prior art.
Figure 9:
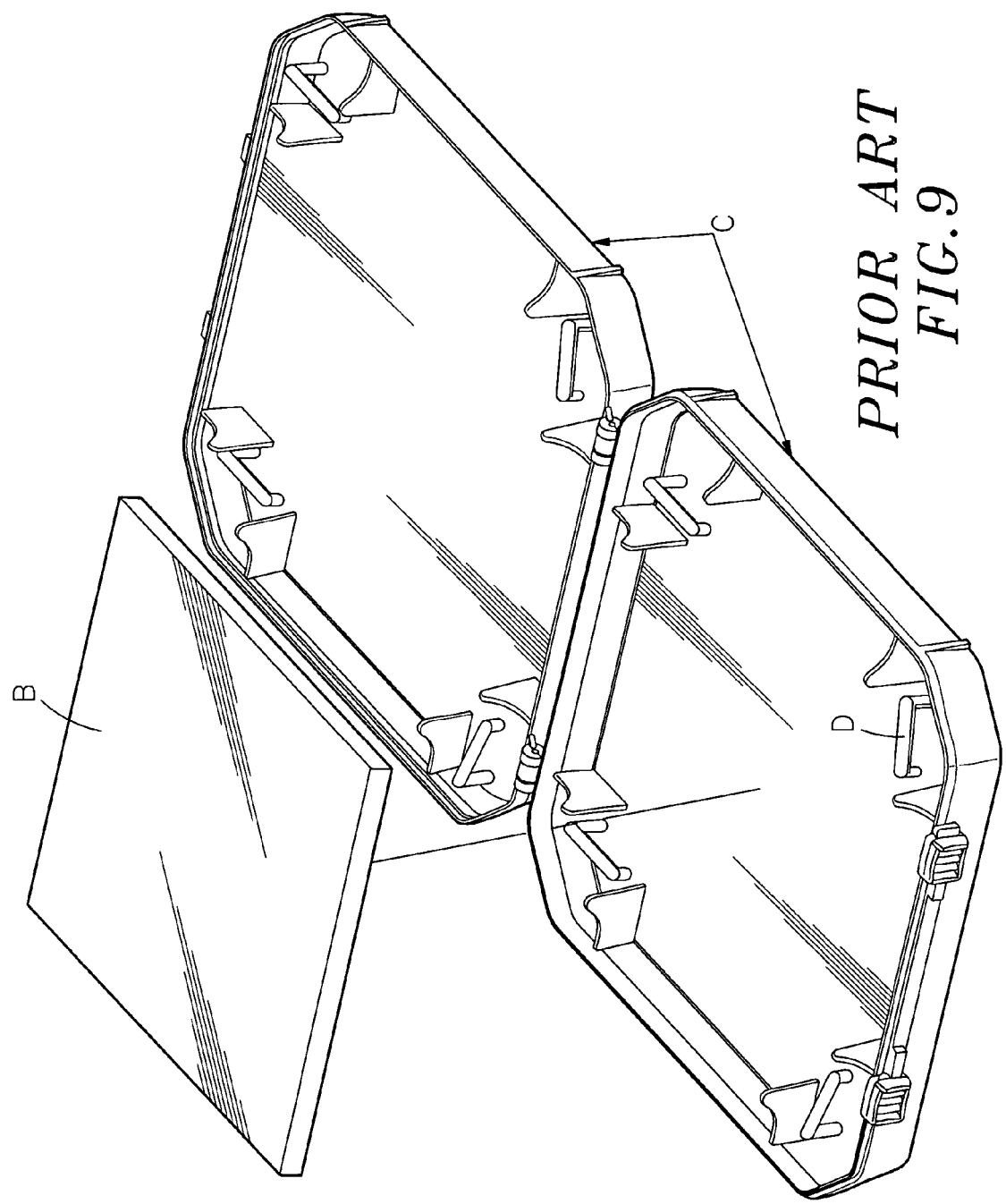
FIG. 9 is a side view of another structure of photo mask delivery box according to the prior art.
Figure 10:
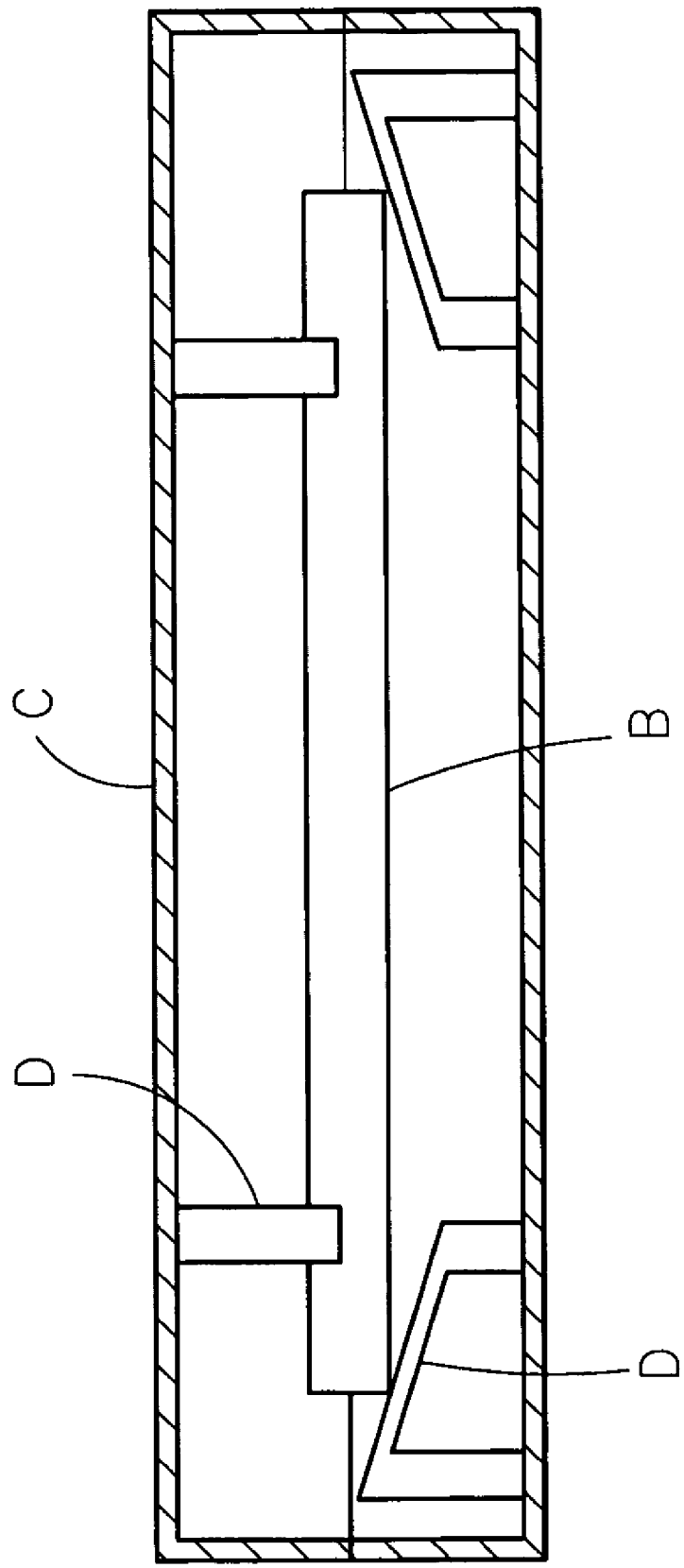
FIG. 10 is a sectional side view of the prior art design shown in FIG. 9.

FIGS. 6 and 7 show another alternate form of the present invention. According to this embodiment, the aforesaid locating blocks 13 are eliminated, and the anchoring means of each photo mask retainer 2 comprises a screw member 29 mounted on the top cover shell 12 and fastened to a respective mounting hole 28 at the base 21 to affix the respective photo mask retainer 2 to the inside wall of the top cover shell 12. The mounting hole 28 can be located on the top or bottom side of the base 21. This embodiment greatly reduces the height of the photo mask retainers 2 in the photo mask delivery box. Same as the aforesaid first and second embodiments, the bearing portions 24 and retaining end portions 25 of the photo mask retainers 2 according to this embodiment are respectively stopped against the vertical peripheral sidewalls and the top surfaces of the storage photo mask 3 to hold the storage photo mask 3 firmly on the bearing blocks 111 inside the accommodating chamber 10, preventing the generation of particles during delivery of the photo mask delivery box.

As indicated above, the photo mask retainer of the present invention has the following advantages:

1. The photo mask retainer 2 has a sloping guide face 23 for guiding the storage photo mask 3 into firm position when the top cover shell 12 is closed on the bottom shell 11, preventing displacement of the storage photo mask 3.

2. The bearing portion 24 and the retaining end portion 25 are formed on the free end of the U-turn 22 and respectively pressed on the vertical peripheral surfaces and the top surfaces of the storage photo mask 3, preventing friction between the storage photo mask 3 and the photo mask retainer 2 during delivery of the photo mask delivery box, therefore this invention prevents the generation of particles during the delivery of the photo mask delivery box.

3. The U-turn 22 is resiliently deformable to absorb shocks during delivery of the photo mask delivery box.

4. Any of a variety of anchoring means may be selectively used to affix the photo mask retainer 2 to the inside wall of the photo mask delivery box subject to the desired height. Although particular embodiments of the invention have been described in detail for purposes of illustration, various modifications and enhancements may be made without departing from the spirit and scope of the invention. For example, adhesive means may be used to bond the photo mask retainers 2 directly to the inside wall of the top cover shell 12; the bearing blocks 111 may be eliminated, and photo mask retainers 2 may be located inside the top cover shell 12 as well as the bottom shell 11 for holding the storage photo mask 3 in a suspending status inside the accommodating chamber 10. Accordingly, the invention is not to be limited except as by the appended claims.

What the invention claimed is:

1. A photo mask delivery box, said photo mask delivery box having a bottom shell and a top cover shell to constitute an accommodating chamber for accommodating a photo mask, a plurality of locating blocks is provided inside said top cover shell, a plurality of retainers disposed on an inner surface of said top cover shell that faced toward said bottom shell to fix said photo mask, the characteristic of each said plurality of retainers is in that:

each said plurality of retainers comprises a base, a top surface of said base having an U-turn, said U-turn disposed extended upward and reversed toward said base, and a clamp extended from the front side of said base to fasten to each said plurality of locating blocks inside said top cover shell, and a free end of said U-turn having a bearing portion and a retaining end portion, wherein said free end of said U-turn is separated from said base.

2. The photo mask retainer as claimed in claim 1, wherein said U-turn has a sloping guide face formed on an outer wall thereof and extending to said bearing portion for guiding the photo mask into contact with said bearing portion and said retaining end portion.

3. The photo mask retainer as claimed in claim 1, wherein said U-turn is resiliently deformable.

4. The photo mask retainer as claimed in claim 1, wherein said U-turn is formed integrally with a part of said base.

5. A photo mask delivery box, said photo mask delivery box having a bottom shell and a top cover shell to constitute an accommodating chamber, a plurality of locating blocks is provided inside said top cover shell, a plurality of bearing blocks disposed on said bottom shell and a plurality of retainers disposed on said top cover shell that faced toward one surface of said bottom shell, and said plurality of bearing blocks and said plurality of retainers used to fix said photo mask, the characteristic of each said plurality of retainers is in that:

each said plurality of retainers comprises a base, a top surface of said base having an U-turn, said U-turn disposed extended upward and reversed toward said base, an anchoring means formed integrally with the front side of said base for press-fitted onto each said plurality of locating blocks inside said top cover shell, and a free end of said U-turn having a bearing portion and a retaining end portion, wherein said free end of said U-turn is separated from said base.

6. The photo mask retainer as claimed in claim 5, wherein said U-turn has a sloping guide face formed on an outer wall thereof and extending to said bearing portion for guiding said photo mask into contact with said bearing portion and said retaining end portion.

7. The photo mask retainer as claimed in claim 5, wherein said anchoring means is a clamp extended from the front side of said base for clamping on said bearing block inside said accommodating chamber of said photo mask.

8. The photo mask retainer as claimed in claim 5, wherein said anchoring means is a socket.

9. The photo mask retainer as claimed in claim 5, wherein said U-turn is resiliently deformable.

10. The photo mask retainer as claimed in claim 5, wherein said U-turn is formed integrally with a part of said base.

11. A photo mask delivery box, said photo mask delivery box having a bottom shell and a top cover shell to constitute an accommodating chamber, a screw member mounted on said top cover shell, a plurality of bearing blocks disposed on said bottom shell and a plurality of retainers disposed on said top cover shell that faced toward one surface of said bottom shell, and said plurality of bearing blocks and said plurality of retainers used to fix said photo mask, the characteristic of each said plurality of retainers is in that:

each said plurality of retainers comprises a base, a top surface of said base having an U-turn, said U-turn disposed extended upward and reversed toward said base, a free end of said U-turn having a bearing portion and a retaining end portion, wherein said free end of said U-turn is separated from said base, and said screw member fastened to a mounted hole at said base to affix each said plurality of retainers to inside wall of said top cover shell so as to reduce the height of each said plurality of retainers in said photo mask delivery box.

12. The photo mask retainer as claimed in claim 11, wherein said U-turn has a sloping guide face formed on an outer wall thereof and extending to said bearing portion for guiding the photo mask into contact with said bearing portion and said retaining end portion.

13. The photo mask retainer as claimed in claim 11, wherein said mounting hole is formed on the top side of said base.

14. The photo mask retainer as claimed in claim 11, wherein said mounting hole is formed on the bottom side of said base.

* * * * *